United States Patent [19]
Mizutani

[11] Patent Number: 5,241,188
[45] Date of Patent: Aug. 31, 1993

[54] APPARATUS FOR DETECTING A FOCUSSING POSITION

[75] Inventor: Hideo Mizutani, Kanagawa, Japan

[73] Assignee: Nikon Corporation, Tokyo, Japan

[21] Appl. No.: 993,460

[22] Filed: Dec. 15, 1992

Related U.S. Application Data

[63] Continuation of Ser. No. 830,213, Jan. 30, 1992, abandoned.

[30] Foreign Application Priority Data

Feb. 1, 1991 [JP] Japan .................................. 3-031343

[51] Int. Cl.$^5$ .......................................... G01N 21/86
[52] U.S. Cl. ...................................... 250/548; 356/401
[58] Field of Search .................. 250/548, 557, 237 R, 250/216; 356/400, 401

[56] References Cited

U.S. PATENT DOCUMENTS 4,853,745  8/1989  Kamiya et al. ..................... 356/401
5,028,797  7/1991  Abe et al. ............................ 250/548

Primary Examiner—David C. Nelms
Attorney, Agent, or Firm—Michael N. Meller

[57] ABSTRACT

An apparatus for detecting a focussing position in a projection exposure system. The apparatus constitutes a detection system for causing the so-called automatic focussing apparatus to operate more precisely with greater reliability and the focussing height at the respective portions of a mask pattern are separately determined, thereby making the accurate discrimination of the focussing position even in cases where any special mark is not used or the intentity of the exposure light is varied moment by moment. This apparatus includes a reference surface formed with a transparent pattern of a given configuration and provided on a stage, an illuminating system for directing an illuminating light to the transparent pattern, and a detection system whereby the reflected light from the mask pattern surface of the projected image of the transparent pattern formed by the projection optical system under the application of the illuminating light is detected through the projection optical system and the transparent pattern thereby detecting a variation in the light quantity of the reflected light. The position (height) where the light quantity variation of the reflected light attains the maximum or minimum represents the focussing position.

12 Claims, 3 Drawing Sheets

APPARATUS FOR DETECTING A FOCUSSING POSITION

This application is a continuation of application Ser. No. 830213, filed Jan. 30, 1992, abandoned.

BACKGROUND OF THE INVENTION

1. Field of the Invention

The present invention relates to an apparatus for detecting a focussing position which is well suited for use in a focussing system for automatically compensating the focussing position of an image of a mask pattern on the surface of a wafer in a projection exposure apparatus used in the manufacturing process of semiconductor devices or the so-called automatic focussing system.

2. Description of the Prior Art

Projection exposure techniques of arranging a mask pattern and a stage through the intermediary of a projection optical system and transferring the mask pattern onto a photosensitive substrate (wafer) on the stage have been put in practical use in various fields of precision processings such as the fabrication of semiconductor devices, and a variety of projection exposure apparatus adapted for various applications in these fields have been available on the market. In the case of these projection exposure apparatus, it is an essential requirement that the exposure surface of a photosensitive substrate must be coincident with a conjugate position (height) of a mask pattern relative to the projection optical system, that is, the focal point of the mask pattern must be coincident with the exposure surface under the application of the actual exposure light. As a result, it has been the usual practice that the projection exposure apparatus for ordinary production purposes incorporates a focussing system which automatically effects the required focussing or the so-called automatic focussing system so as to realize the consistency of both the efficiency and reliability of the projection exposure.

While, as one method for such focussing system, a system has also been reported in which as disclosed for example in Japanese Laid-Open Patent Publication No. 57-212406, a special mark formed on the surface of a mask pattern is directly projected onto the exposure surface of a photosensitive substrate and the resulting projected image is optically detected through the projection optical system and the mark thereby directly discriminating the focussing position, generally a system has been employed in which means A for directly detecting the focussing of the mask pattern surface on a reference surface formed on the stage by use of the exposure light is combined with means B which is adapted to measure the stage-side height below the projection optical system and zero-adjusted to the focussing height by means of the means A whereby the height of the exposure surface is indirectly detected by use of the measuring means B thereby guiding the exposure surface up to the focussing height. Then, as the means A utilizing the exposure light, as for example, Japanese Laid-Open Patent Publication No. 1-286418 discloses a system in which a special mark formed on the surface of a mask pattern is projected onto a reference surface. According to this system, the projected image of the mark formed on the reference surface is observed through the projection optical system and the mark so that the light quantity peak of the projected image regulated by the mark is detected thereby discriminating the focussing. Also, as an example of the measuring means B for measuring the stage-side height, as for example, Japanese Laid-Open Patent Publication No. 1-04962 discloses a system in which the height of the exposure surface just below the projection optical system is measured by using an optical system obliquely attached to the outer side of the projection optical system.

Presently, in the case of semiconductor memory devices which are particularly high in processing accuracy, the projection with a depth of focus of about 1 $\mu$m is effected by using the i-line of 365 nm in wavelength and the focussing positioning accuracy of 0.1 $\mu$m or less is usually required, whereas an extremely high accuracy of 0.05 $\mu$m or less is required in the case of a special projection exposure utilizing an interference phenomenon of the exposure light such as the one disclosed in Japanese Laid-Open Patent Publication No. 62-50811. In order to satisfy such high degree of accuracy, it is no longer possible to ignore any small bending and slanting of a mask itself with the result that such high accuracy cannot be dealt with by the conventional method of detecting the focussing position of a mark provided in one corner of a mask pattern and causing it to serve as the focussing position of the mask pattern on the whole and thus it is required that each of the portions in the photosensitive substrate-side exposure area is adjusted up to the focussing height in one-to-one correspondence to one of the portions within the transfer area of the mask pattern. Thus, a method has been conceived in which the focussing position is obtained for each of the portions within the transfer area of the mask pattern and the variations in the focussing position (height) of the respective partial areas are absorbed as far as possible by slanting the stage.

While, in this method, the focussing height is obtained as a matter of course for each of the portions in the actual mask pattern immediately before the exposure and transfer, this cannot be performed by the conventional method of directly detecting the focussing position through the use of the exposure light. For example, in order to perform the system disclosed in the previously mentioned Japanese Laid-Open Patent Publication No. 1-286418, it is necessary to arrange a focussing position detection mark on each of the portions within the mask pattern transfer area and this is an unfeasible since it produces a detrimental effect on the level of integration of mask patterns.

Also, in accordance with the systems of the previously mentioned Japanese Laid-Open Patent Publications No. 57-212406 and No. 1-286418 the optical information from a projected image on an exposure surface goes back partially through the optical path of an exposure light and reaches a detector, with the result that the reflected light of the exposure light in the optical path section, e.g., the exposure light reflected from the surfaces of the lenses in the projection optical system, the back side of the mask pattern and the both sides of the mask is returned to reach as such up to the detector and therefore the detector must subtracts a huge beckground due to the reflected light of the exposure light to detect the peak of the optical information. As a result, in the case of (a) where the area of the mark accounts for a small part of the illumination field (the mask pattern) of the exposure light, (b) where the light shielding area accounts for a large part of the mask pattern (the amount of reflection from the back side of the mask pattern is large) or (c) where the output of the light source varies causing the intensity of the exposure light to vary moment by moment, the peak detection by the detector becomes difficult and there is the possibility of the discrimination of the focussing position failing to function properly.

SUMMARY OF THE INVENTION

It is the primary object of the present invention to provide an improved detecting apparatus so designed that not only it is easy to separately obtain a focussing position (height) for each of the portions of an actual mask pattern immediately before the exposure and transfer and there is no need to arrange any special mark within a transfer area of the mask pattern but also the discrimination of the focussing position with a high degree of reliability can be ensured even in cases where the light shielding area accounts for a large part of the mask pattern and where the intensity of the exposure light is varied moment by moment.

In accordance with a basic idea of the present invention, there is provided a focussing position detecting apparatus which is designed to detect a stage-side conjugate position of a mask pattern surface with respect to a projection optical system for projecting an image of the mask pattern onto a photosensitive substrate on a stage. The apparatus includes reference surface means having a transparent pattern of a given configuration formed on the stage, illumination means for directing an illuminating light to the transparent pattern, and detecting means whereby the reflected light from a projected image of the transparent pattern formed on the mask pattern surface by the projection optical system under the application of the illuminating light is again received through the projection optical system and the transparent pattern to detect a variation in the light quantity of the reflected light passed through the transparent pattern.

In accordance with a preferred aspect of the present invention, the focussing position detecting apparatus further includes position adjusting means responsive to the output of the detecting means to move the stage to a position where the variation of the light quantity becomes maximum or minimum, and measuring means for measuring the direction of a shift in position at a different location on the stage on the basis of the position of the reference surface at the moved stage position.

In accordance with another preferred aspect of the present invention, the measuring means includes a scanning mechanism for scanning the different location on the stage to below the visual field of the projection optical system and a measuring device fixed to the projection optical system to measure the stage-side position relative to the projection optical system in the optical path.

In accordance with still another aspect of the present invention, the reference surface means includes the transparent pattern formed as a line-and-space pattern arranged obliquely relative to the mask pattern or a checkered pattern.

In accordance with the focussing position detecting apparatus of the present invention, the transparent pattern formed on the reference surface of the stage is projected onto the mask pattern surface through the projection optical system in the opposite direction to the exposure light so that a reflected image of the resulting projected image from the mask pattern surface is again passed through the transparent pattern and a variation in the light quantity is detected thereby discriminating the focussing position. In other words, considering the mask pattern surface as a projection surface, the projected image of the transparent pattern by the projection optical system is formed on the mask pattern surface and that position (height) of the reference surface ensuring the maximum possible capture of the optical information from the projected image due to the transparent pattern is determined by utilizing the fact the blur of the projected image reimaged by the reflected light from the mask pattern surface is reduced to minimum. At this time, if it is arranged so that as for example, the shutter of the exposure light source is closed to prevent the exposure light from directly falling on the transparent pattern and thereby to prevent the mask pattern surface from being illuminated by the exposure light, the background of the light quantity variation detection can be conveniently reduced. Also, while the exposure light from the exposure light source may be diverged and directed to the transparent pattern as the illuminating light directed to the transparent pattern, a separate exclusive light source which is practically equal in output wavelength to the exposure light may be provided to apply the desired illuminating light.

Then, as the means for directing the illuminating light to the transparent pattern, a combination of a mirror and a prism or a bundle of glass fibers may be used. In such a case, the optical information from the projected image goes back through a part of the optical path of the illuminating light and reaches up to the detecting means so that the undesired reflected light of the illuminating light from that portion also reaches the detecting means and it becomes a background during the light quantity variation detection thereby impeding the detection of a variation in the light quantity of the projected image. However, the degree of the impediment is far small in correspondence to the decrease in the illuminated area as compared with the conventional case in which the whole mask pattern surface is exposed to the exposure light. Therefore, in order that the detection of a variation in the light quantity of the projected image may be effected with a high degree of reliability, it is convenient to take for example the following measures:

(a) To reduce the rate of reflection of the illuminating light from the portions in question through some contrivances for the surface treatment of the optical elements and the arrangement of the optical path, and (b) To prevent the reflected light of the illuminating light from reaching the detecting means. By combining these measures, it is possible to reduce the background of the detection and thereby to effect the desired peak detection with a sufficiently high reliability even if the area of the transparent pattern is not large.

On the other hand, the stage is provided with a mechanism capable of moving any arbitrary location on the stage into a position just below the projection optical system so that the stage can be scanned within the visual field of the projection optical system so as to move a projected image of the open pattern onto any arbitrary location on the mask pattern. In this way, it is possible to detect the focussing position (height) at a large number of locations on the mask pattern and thereby to know the position and posture of the exposure surface of the photosensitive substrate which are best suited for the whole surface of the mask pattern.

Also, in accordance with still another aspect of the present invention the focussing position detecting apparatus includes, in addition to the means for directly discriminating the conjugate plane to the mask pattern with respect to the projection optical system at the reference surface on the stage by means of the illuminating light, means for measuring the exposure surface position (height) subjected to the zero adjustment by the discriminating means whereby the calibration (zero adjustment) of the measuring means is effected in a condition where the reference surface has been brought into registration with the conjugate plane to the mask pattern by the position adjusting means and the measuring means is allowed to discriminate the direction of a shift in position (positive or negative) as compared with the zero point at any arbitrary location on the stage.

Further, in accordance with still another aspect of the present invention the focussing position detecting apparatus includes an optical measuring device attached to the projection optical system whereby the discrimination of the focussing point at any arbitrary location on the stage is effected by a combination of the optical measuring device and the scanning mechanism of the stage. The optical measuring device is composed for example of a combination of a projector having an optical path set to fix its reflection point at substantially the center of the visual field of the projection optical system and a photosensor array and the position (height) just below the projection optical system is measured by means of the reflected light spot position on the array.

Further, in accordance with still another aspect of the present invention the focussing position detecting apparatus gives a consideration to the possibility of the mask pattern causing an interaction between it and the projected image of the transparent pattern and impeding the detection of the maximum or minimum variation of the light quantity at the mask pattern surface which has been explained as a uniform projection surface. In other words, since the local reflectance of the mask pattern surface differs from one location to another depending on the presence or absence of the mask pattern, where the projected image of the transparent pattern is exactly matched with the mask pattern, the position at which the maximum or minimum variation of the light quantity is obtained does not always coincide with the focussing position. As a result, the configuration of the transparent pattern must be selected in a manner that the reflected light of its projected image does not exactly match the mask pattern. Since the mask patterns of semiconductor integrated circuits are usually composed of a large number of crossed parallel lines and a small number of oblique lines of a specified angle, it is convenient to select so that the transparent pattern configuration is in the form of a plurality of parallel lines which are not parallel to any of the former lines. In this connection, the parallel line configuration is selected on the ground that a variation of the light quantity due to the focussing point is abrupt. Also, the parallel lines are crossed at right angle in a sense of avoiding the effect of the astigmatism of the projection optical system. Further, the same effect can be obtained even if the transparent pattern is composed of a checkered pattern. It is to be noted that the transparent pattern can be composed of a pattern of a plurality of paralleled line-shaped slit openings or a phase-shifting grid.

The above and other objects, features and advantages of the present invention will become more apparent from the following description of its illustrative embodiments without any intention of limitation when taken in conjunction with the accompanying drawings.

DESCRIPTION OF THE PREFERRED EMBODIMENTS

The schematically illustrated automatic focussing position detecting apparatus according to an embodiment of the present invention is mounted on a projection exposure apparatus used in the manufacture of semiconductor integrated circuits and the apparatus performs the operation of detecting the height of a conjugate plane with respect to a mask pattern on the whole and adjusting the height and inclination of an exposure surface on a wafer mounted on an X-Y stage thereby bringing the exposure surface into coincidence with the conjugate plane.

Figure 1:
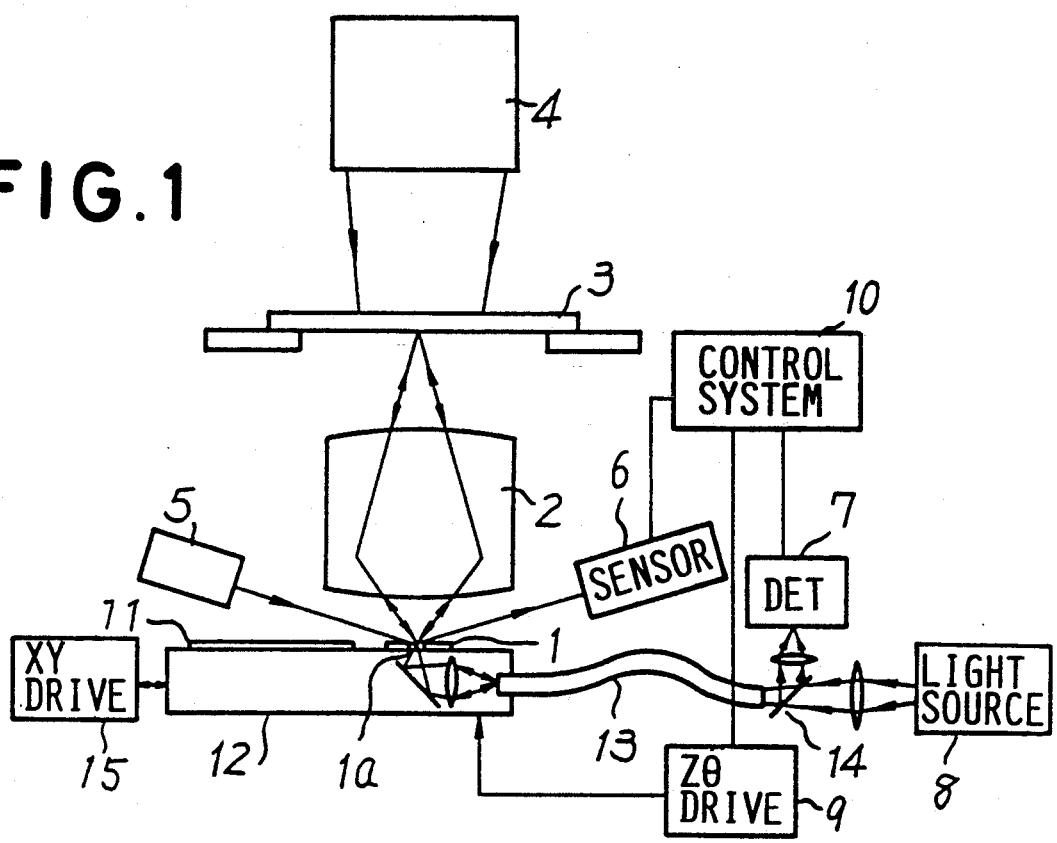
FIG. 1 shows schematically the principal construction of a focussing position detecting apparatus according to an embodiment of the present invention.

In FIG. 1, a mask 3 containing a mask pattern on its lower surface side is positioned opposite to a stage 12 through a projection lens 2 and it is illuminated by an exposure illumination system 4 during the period of projection and exposure. With a wafer 11 mounted on it, a stage 12 is movable by an X-Y drive system 15 so as to bring any arbitrary location on the stage 12 to just below the projection optical system 2 and the whole stage 12 is adjustable to any arbitrary height and inclination by a Z-$\theta$ drive system 9. Provided on the stage 12 is a fiducial surface 1 formed with a given open pattern 1a as a transparent pattern, and the open pattern 1a is combined with an illumination optical system including an illumination light source 8, a glass fiber cable 13, etc., and a detection optical system including the glass fiber cable 13, a light quantity detector 7, a half-mirror 14, etc. Attached to the projection optical system 2 is an oblique incidence focussing sensor (a slit light projector 5 and a photosensor 6) for wafer surface position detecting purposes The outputs of the sensor 6 and the detector 7 are applied to a control system 10 so that the drive system 9 is controlled by the control system 10.

With the automatic focussing position detecting apparatus constructed as above described, when the illuminating light from the illuminating light source 8 is directed to the open pattern 1a through the cable 13, the light spatially modulated in accordance with its open pattern is emitted upwardly from the open pattern 1a and it forms a projected image of the open pattern 1a on the mask pattern surface through the projection optical system 2. By scanning the fiducial surface 1 within the visual field of the projection optical system 2 by means of the drive system 15, the projected image can be moved to any of arbitrary locations on the mask pattern surface to separately discriminate the focussing point on each of the respective locations.

Also, the optical information from the projected image on the mask pattern surface goes back through the optical path of the illuminating light from the open pattern 1a and it is imaged at the conjugate plane to the mask pattern with respect to the projection optical system 2. At this time, if the height of the reference surface is in a conjugate positional relation with the mask pattern surface with respect to the projection optical system 2, the projected image on the mask pattern surface becomes one which is in focus and having a clear boundary and the second projected image on the reference surface due to the reflected light of the first projected image also becomes one which is in focus and having a clear boundary In this case, since the second projected image is naturally identical in form, size and posture with the open pattern 1a, the optical information from the projected image on the mask pattern surface is incident to the maximum degree on the open pattern 1a so that it proceeds through the detection optical system and reaches the detector 7 threrby applying the peak of the light quantity received. On the other hand, where the height of the reference surface is deviated from the conjugate plane to the mask pattern surface, each of the projected image on the mask pattern surface and the second projected image on the reference surface becomes one which is out of focus and having a blurred boundary. As a result, the optical information is lost in correspondence to an amount by which the second projected image deviates from the open pattern 1a and the optical information enters as such into the open pattern 1a, thereby decreasing the received light quantity reaching the detector 7.

Thus, the stage 12 is moved by the drive system 15 so as to successively position the projected image at a plurality of predetermined locations on the mask pattern surface so that at each of these locations the height of the stage is adjusted by the control system 10 and the drive system 9 to such height that the detector 7 detects a variation of the light quantity and the resulting height information is successively stored in a memory. The optimum angle of inclination of the stage is calculated from the resulting height distribution information and the inclination of the stage 12 is adjusted to the calculated angle by the drive system 9.

On the other hand, after the inclination has been adjusted, the projected image is again moved to substantially the center of the mask pattern and again the stage height is adjusted by the drive system 9 until the fiducial surface 1 attains the height of the focussing point. Thereafter, the oblique incidence focussing sensor (5, 6) is subjected to the zero adjustment by means of the fiducial surface 1 which has been adjusted to the focussing height. In other words, the height of the reflected beam spot at the fiducial surface 1 is stored as the zero point so that thereafter each time the visual field of the projection optical system is scanned to any arbitrary location of the stage, the height of the exposure surface of the photosensitive substrate is measured in accordance with the height of the reflected beam spot at the focussing sensor (5, 6) and the stage height is adjusted by the control system 10 through the drive system 9 in such a manner that the exposure surface height attains the zero point height.

Figure 2:
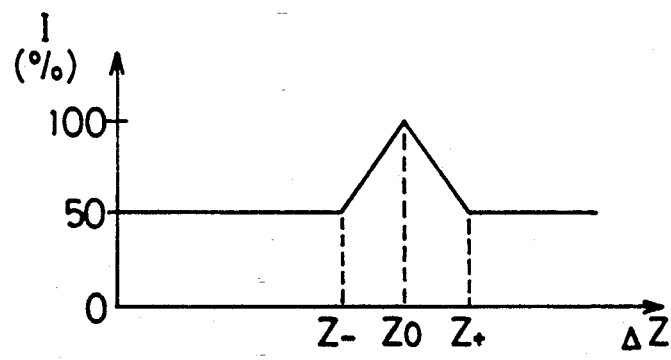
FIG. 2 is a graph useful for explaining the detection of a light quantity variation according to the embodiment of the present invention.

Now describing the detection of focussing planes in various cases in accordance with the present embodiment in greater detail, FIG. 2 is a graph showing the variations of the detected light quantity I (the ordinate) with the vertical position Z (the abscissa) of the focussing plane. In the Figure, the detected light quantity I is the light quantity of the light incident on the detector 7 and this light is the return light of the light emitted upwardly from the open pattern 1a of the embodiment apparatus, reflected by the mask pattern surface, imaged again by the projection optical system 2 and passed through the open pattern 1a. From FIG. 2 it wiil be seen that the detected light quantity I reaches its peak at a focussing position $Z_0$. It is to be noted that if special light directing means (FIG. 5) which will be described later is used in combination with the present embodiment, the detected peak/background ratio can be caused to approach 50% and the detection can be effected with higher reliability.

Figure 3:
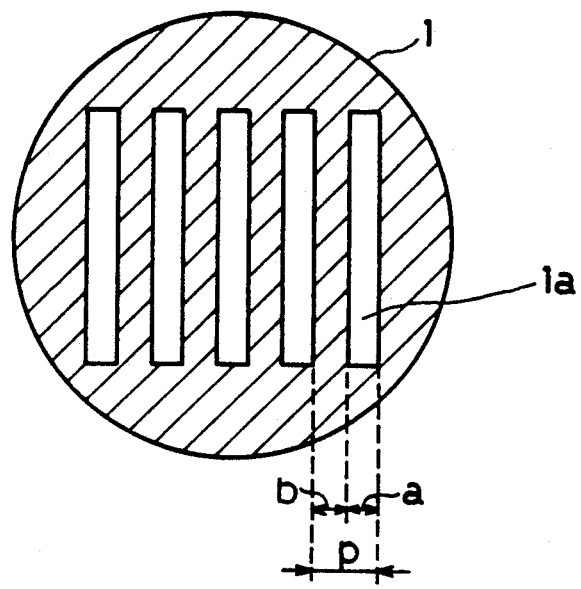
FIG. 3 is a plan view of the fiducial plate in the embodiment of the present invention.

In FIG. 2, the abscissa corresponds to the height position of the stage 12 so that centering the focussing height $Z_0$, $Z_{31}$ represents one side near to the projection optical system 2 and $Z_{30}$ represents the other side far from it. The ordinate represents the light quantity detected by the detector 7. When the stage 12 is moved vertically, the light quantity becomes maximum at a certain height and this is the focussing height $Z_0$. To detect it, the stage 12 is moved vertically along the optical axis of the projection optical system 2 in accordance with the detection signal of the oblique incidence focus sensor 6. By simultaneously monitoring the light quantity of the detector 7, the graph of FIG. 2 can be obtained. The focussing height $Z_0$ is calculated on the basis of this graph by the automatic focussing control system 10 and thereafter the detected position of the oblique incidence focussing sensor (5, 6) is brought into coincidence with it. Then, even if the stage 12 is moved by the X-Y drive system 15 so that the wafer 11 is moved to below the projection optical system 2, the wafer 11 can be positioned at the focussing plane of the projection optical system 2 by means of the oblique incidence focussing sensor (5, 6). It is to be noted that the variation of a signal such as shown in FIG. 2 should preferrably have as large a slope as possible For this purpose, the open pattern 1a of the fiducial plate 1 must be of a suitable line width. For instance, a line-and-space pattern such as shown in FIG. 3 can be conceived as the projection pattern. In this case, if P represents the pitch of the open pattern 1a of the fiducial plate 1 and a the width of the openings and if the duty ratio (a/p) is 50%, then the variation of the detected light with the focussing position in FIG. 2 is approximately given by the following equation $$|Z_0 - Z_-| = |Z_+ - Z_0| = a/2\tan\theta \qquad (1)$$

where $\theta$ is the oblique angle of the light beams and the estimation is made by ignoring any diffraction. For instance, where the numerical aperture NA of the projection optical system 2 is 0.5, $\sigma$0.5 and a=2 $\mu$m, the value of $\theta$ becomes 14.5 degrees and $|Z_0 - Z_-|$ becomes 3.9 $\mu$m.

Then, in the case of a transparent mask 3 without any mask pattern, the lower surface or the glass surface of the mask 3 becomes a reflecting surface and its reflectance is about 4%. Even in this case, the background is so small that the focussing position can be satisfactorily detected by increasing the detection sensitivity of the apparatus of the present embodiment Also, in the case of the ordinary mask containing a mask pattern, the chromium surface of the mask pattern can ensure a reflectance of 10 to 70% and thus it is of course possible to detect the focussing position satisfactorily. Further, where a low-reflectance AR coat is applied to the chromium surface, a reflectance of several % is ensured and thus there is no problem.

Also, usually there is the difference in height or a step at the boundary between the chromium pattern of the mask and the glass surface and there are two levels of conjugate planes to the mask pattern surface However, the thickness of the chromium pattern is generally not greater than 100 nm and therefore there is practically no problem if the projection optical system 2 is of the reduction magnification type. For instance, if the thickness of the chromium pattern is 100 nm and the reduction projection magnification is 1/5 times, the error of the conjugate plane due to the step of the chromium amounts to 8 nm and this is of a negligible level.

Next, a description will be made of the case where the mask used consists of a mask formed with phase shifters (phase-shifting mask) such as shown in Japanese Laid-Open Patent Publication No. 62-50811. Assuming now that the film thickness d of the phase shifters is selected as $d = \lambda/2(n-1)$ with n representing its refractive index and $\lambda$ the wavelength of the illuminating light, the reflected light at the surface of the phase shifters has an optical path length which is shorter than that of the reflected light at the glass surface of the mask by an amount corresponding to two times of the film thickness d of the phase shifters or $2d = \lambda/(n-1)$. In this case, since the value of n is usually selected to be about 1.5, this difference in optical path length becomes $2\lambda$ (the integral times the wavelength) so that apparently there is no difference in terms of the reflected light as compared with the case involving no phase shifter and it is seen that its effect is less.

From the foregoing it will be seen that the mask pattern surface can be considered to be the ordinary reflecting surface irrespective of its kind and therefore the detection of a focussing position with a high degree of accuracy is possible by the apparatus according to the present invention.

Figure 4A:
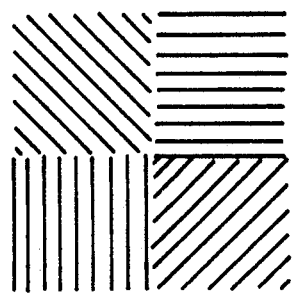
FIGS. 4a and 4b are plan views showing another examples of the open pattern configuration on the fiducial plate.
Figure 4B:
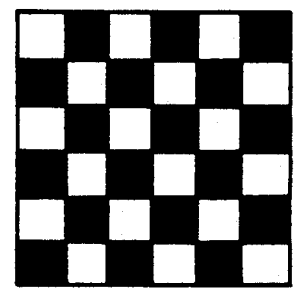

On the other hand, in order to reduce further the effect due to the chromium pattern of the mask 3 and prevent the effect of the astigmatism, etc., during the detection of the focussing position in the vicinity of the visual field of the projection optical system 2, another projection pattern (the configuration of the open pattern 1a) such as shown in FIG. 4a or 4b can be considered. The pattern of FIG. 4a is a combination of vertical, horizontal and oblique patterns and the pattern of FIG. 4b is a checkered flag pattern. Each of these patterns is formed within a square area of 100 $\mu$m to 500 $\mu$m per side on the fiducial surface 1. Also, even in the case of the pattern shown in FIG. 3, it is effective to simply incline by about 10 to 15 degrees the long side of its slit-like open pattern with respect to the direction of the side of the mask pattern. The reason is that there are many cases where the mask pattern used in the manufacture of semiconductor devices is composed of vertical and horizontal patterns (0 degree, 90 degrees) which cross at right angles.

Figure 5:
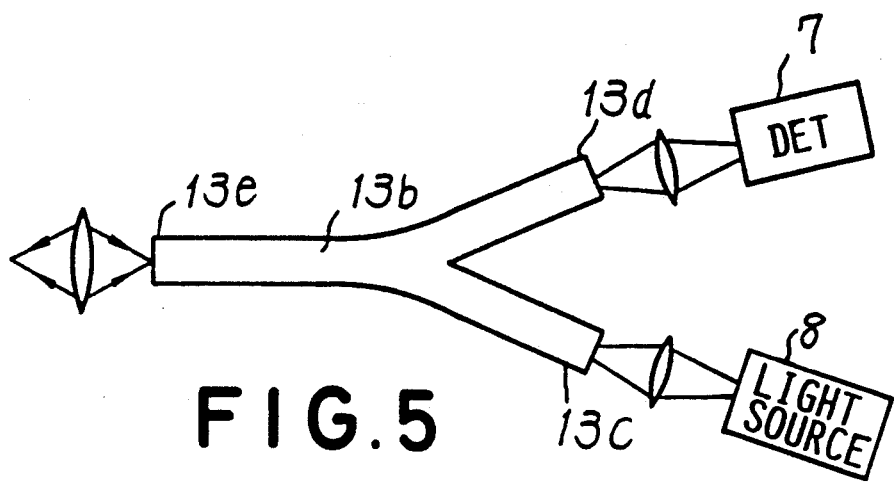
FIG. 5 shows schematically another example of the light directing means in the embodiment of the present invention.

Referring to FIG. 5, there is illustrated an example of special light directing means for preventing the occurrence of a phenomen causing a detection background due to the incidence on the detector 7 of the reflected light from each of the optical elements of the illuminating optical system including the illuminating light source 8. In FIG. 5, the two-way splitting fiber cable 13b is such that a large number of fiber stocks forming an end face 13d and a large number of fiber stocks forming an end face 13c are bundled so as to be randomly gathered at an end face 13e, with the result that the illumination optical path and the detection optical path are completely separated from each other and the reflected light of the illuminating light from each of the end faces 13c and 13e are prevented from reaching the end face 13d. As a result, by connecting the end face 13d to the detector 7, the end face 13c to the light source 8 and the end face 13e to the open pattern 1a, respectively, the background of the detection is reduced as compared with the case of FIG. 1 in which the light transmitting and receiving systems are separated by use of the half mirror 14.

Thus, in accordance with the present embodiment, by virtue of the fact that the open pattern 1a of the fiducial surface 1 formed on the stage 12 is projected onto the mask pattern surface through the projection optical system 2 and its return light due to the reflection from the mask pattern surface is again observed from the open pattern 1a of the fiducial surface 1, the TTL focussing operation directly performed through the projection optical system 2 can be effected at any arbitrary location on the mask pattern surface and therefore it is easy to effect the focussing detection at the central portion of the image which has heretofore been difficult. Also, by arranging the end face of the fiber cable 13b at a position conjugate to the exit pupil of the projection optical system 2 and also by selecting the size of this end face to be substantially equal to the size of the light source image of the projection optical system, it is possible to detect the focussing condition of the reflected light of the projected image with a $\sigma$ value equivalent to that $\sigma$ value which is determined by the ratio of the numerical aperture of the exposure illumination optical system to the numerical aperture of the projection optical system 2 during the actual performance of the exposure and transfer (i.e., that value which is dependent on the ratio between the numerical aperture of the illumination optical system due to the fiber cable 13b and the numerical aperture due to the size of the light source image of the projection optical system 2) thereby making it possible to expect a high focussing accuracy.

In this connection, it is convenient to select the place of arrangement of the fiducial surface 1 in such a manner that it is positioned just below the projection optical system 2 during the loading of the wafer 11 and this has the effect of making it possible to effect the focussing along with the loading and eliminating any time loss in operation. In this case, each time the wafer is changed, there is usually a chance of making possible the TTL focussing for about 1 minute or so and thus it is possible to easily cope with any variation with time of the focussing position of the projection optical system 2.

While the projected pattern (the open pattern 1a) of the fiducial surface 1 should preferably be detected by the oblique incidence focussing sensor (5, 6), if the detection range of the oblique incidence focussing sensor (5, 6) is small, the detection of the focussing height is possible by detecting any other location than the open pattern 1a on the fiducial surface 1 through the oblique incidence focussing sensor (5, 6). In this case, while the flatness and inclination of the fiducial surface 1 must be good enough, any slight error can be compensated for as an offset value at a later time.

Figure 6:
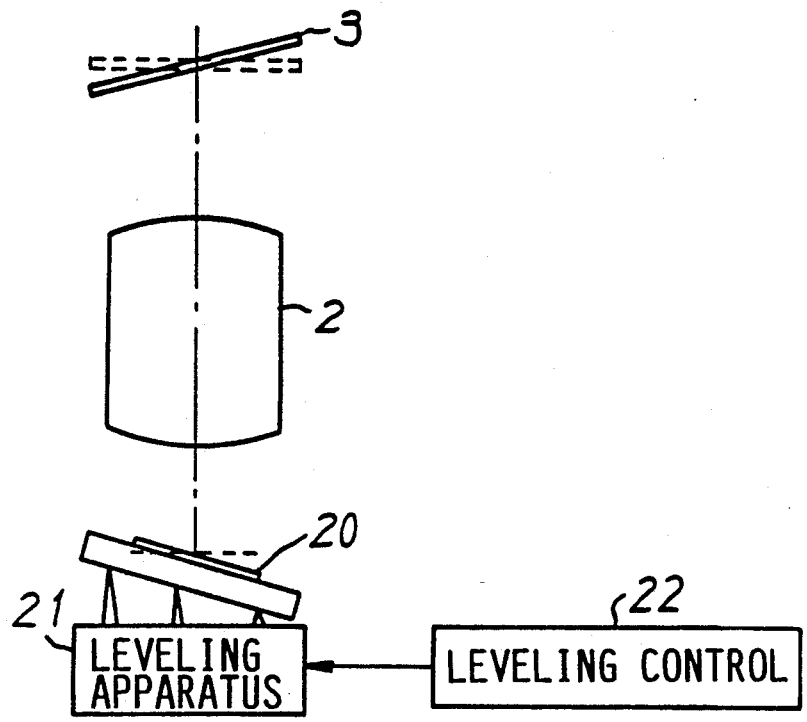
FIG. 6 shows schematically an example of a leveling apparatus.

On the other hand, where the mask 3 is mounted in an inclined manner as shown by the solid line in FIG. 6, a wafer-side conjugate plane 20 is in a correspondingly inclined position (the so-called "swing" relation). However, the wafer surface can be positioned at the plane 20 conjugate to the mask surface by successively effecting the focussing detection on the whole mask surface, calculating from the resulting values an inclination which must be imparted to the wafer surface and driving a stage leveling apparatus 21 through a leveling control system 22.

Still further, by providing a high reflecting surface on the outer side of the circuit pattern of the mask 3, it is possible to increase the amount of light returning from the reflected light of the projected image on the mask pattern surface toward the detector 7 and the detection with greater accuracy can be expected.

Figure 8:
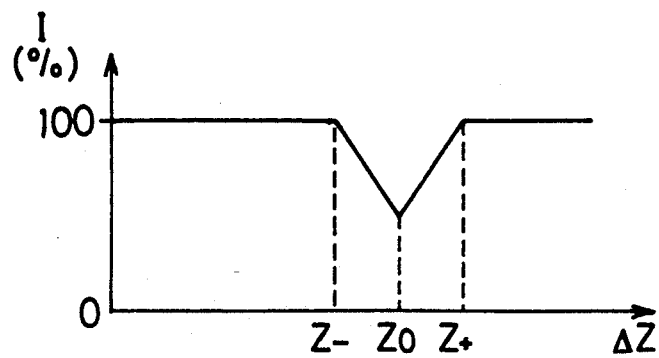
FIG. 8 is a graph for explaining the light quantity variation detection by means of the fiducial plate shown in FIG. 7.
Figure 7:
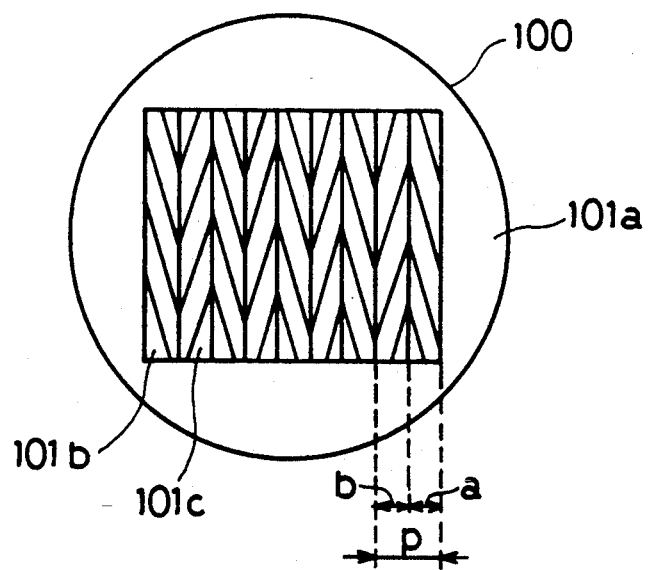
FIG. 7 is a plan view of the fiducial plate in another embodiment of the present invention.

Then, as the open pattern 1a of the fiducial plate 1, a fiducial plate 101 composed of a phase-shifting grid as shown in FIG. 7 can be used in addition to the grid composed of slit-like openings as mentioned previously. In other words, a pattern section 101a includes parallel elongated line portions 101b and 101c which are both made of transparent areas but are different in thickness so that the light beams passed through them produce a phase difference therebetween. More specifically, they are formed on a glass sheet by etching it or by depositing a transparent material on it by evaporation to have different thicknesses so that a predetermined phase difference is produced between the light beams passed through the adjacent lines. Where such phase-shifting grid is used, there is the advantage that since the light is not blocked as compared with the fiducial plate 1 shown in FIG. 3, the detected light quantity can be increased and also the back reflection of the open pattern can be eliminated threrby improving the detection acuracy. By suitably selecting a design phase difference for the phase-shifting grid, it is possible to produce a detection output signal such as shown in FIG. 8 in contrast to FIG. 2. In this case, detected as the focussing position is a position $Z_0$ on the abscissa at which the signal intensity of the detected light quantity I shown on the ordinate is reduced to minimum and the remaining processing is the same as the previously mentioned embodiment.

The above-mentioned embodiments are intended in no way to limit the present invention and various modifications and changes thereto would be apparent to those skilled in the art within the claimed scope of the present invention.

In accordance with the focussing position detecting apparatus of the present invention, the focussing point can be separately discriminated easily on each of various portions on the actual mask pattern just prior to the exposure and transfer and there is no need to any special mark within the transfer area of the mask pattern. Moreover, even in cases where the light shielding area accounts for a large part of the mask pattern or the exposure light intensity changes moment by moment, the discrimination of the focussing point can be effected with a high degree of reliability.

Further, the focussing position detecting apparatus according to the present invention is useful in that the means for measuring a position on the stage is used to make it possible to adjust such that the exposure surface is brought into coincidence with the focussing position at any arbitrary location on the stage or the measuring device for measuring the position of the open pattern scanned on the stage to make it possible to adjust so that the exposure surface is brought into coincidence with the focussing position at any arbitrary location on the stage, and that the discrimination of the focussing point can be effected without being subjected to the effect of the mask pattern.

What is claimed is:

1. An apparatus for detecting a position of a conjugate plane at which a projected image of an object surface is formed by a projection optical system or a focussing position, said apparatus comprising:

projection object means including at least a first surface having reflecting properties and arranged on said object surface;

stage means for holding a photosensing substrate having a photosensing surface to be positioned at said conjugate plane in a manner that said photosensing substrate is movable in the direction of an optical axis of said projection optical system;

reference surface means provided on said stage means and adapted to be arranged on the basis of a position conjugate to said first surface arranged on said object surface with respect to said projection optical system;

a transparent pattern of a predetermined configuration formed on a surface of said reference surface means;

illuminating means for supplying an illuminating light through said transparent pattern in such a manner that said illuminating light reaches said first surface from said transparent pattern through said projection optical system;

means for receiving a reflected light of said illuminating light from said first surface through said projection optical system and said transparent pattern; and detecting means for detecting a variation in the light quantity of said reflected light received by said means.

2. An apparatus according to claim 1, further comprising:

position detecting means responsive to an output of said detecting means to move said stage means along the optical axis direction of said projection optical system; and first measuring means for measuring a position of said stage means relative to said projection optical system.

3. An apparatus according to claim 2, wherein said stage means includes scanning means for moving a position of said transparent pattern relative to said first surface in a direction parallel to said reference surface, and second measuring means for measuring the position of said transparent pattern moved by said scanning means.

4. An apparatus according to claim 3, wherein said projection object means includes a mask pattern containing pattern elements having a directivity within said first surface, and wherein said transparent pattern has a different directivity such that said transparent pattern is in an inclined relation with an image of said pattern elements within a composite image of said transparent pattern and said mask pattern.

5. An apparatus according to claim 4, wherein said transparent pattern comprises a plurality of parallel line patterns.

6. An apparatus according to claim 4, wherein said transparent pattern comprises a checkered pattern.

7. An apparatus according to claim 1, wherein said illuminating means includes a plurality of first optical fiber strands for directing an illuminating light to said transparent pattern, wherein said means for receiving reflecting light includes a plurality of second optical fiber strands for directing said reflected light returning from said transparent pattern to a surface of said means for receiving reflected light, and wherein said first and second optical fiber strands are bundled to diverge randomly at a terminal end in said transparent pattern portion.

8. An exposure apparatus for projecting and exposing a pattern formed on a pattern surface of a mask on a surface of a substrate by a projection optical system, said apparatus comprising:

first stage means for supporting said mask;

second stage means for supporting said photosensitive substrate;

first illuminating means for illuminating said mask with an exposure light;

first measuring means for detecting a position of said substrate in the direction of an optical axis of said projection optical system;

means responsive to a signal from said first measuring means to adjust a space between said projection optical system and said substrate and thereby to position said substrate at an image plane position of said projection optical system;

reference surface means provided on said second stage means and adapted to be arranged on the basis of a position conjugate to said master pattern surface arranged on an object surface with respect to said projection optical system;

a transparent pattern of a predetermined configuration formed on a surface of said reference surface means;

second illuminating means for supplying an illuminating light through said transparent pattern so as to reach said mask pattern surface from said transparent pattern through said projection optical system;

means for receiving a reflected light of said illuminating light from said mask pattern surface through said projection optical system and said transparent pattern; and detecting means for detecting a variation in the light quantity of said reflected light received by said for receiving a reflected light means.

9. An exposure apparatus according to claim 8, wherein said second stage means includes scanning means for moving a position of said transparent pattern relative to said mask pattern surface in a direction parallel to said reference surface, and second measuring means for measuring the position of said transparent pattern moved by said scanning means.

10. An exposure apparatus according to claim 9, wherein said mask pattern means includes a mask pattern containing pattern elements having a directivity within said mask pattern surface, and wherein said transparent pattern has a different directivity such that said transparent pattern is in an oblique relation with an image of said pattern elements within a composite image of said transparent pattern and said mask pattern.

11. An apparatus according to claim 8, wherein said second illuminating means includes a plurality of first optical fiber strands for directing an illuminating light to said transparent pattern, wherein said means for receiving a reflected light includes a plurality of second optical strands for directing said reflected light returning from said transparent pattern to a surface of said means for receiving a reflected light, and wherein said first and second optical fiber strands are fundled in a randomly divergent manner at a terminal end in said transparent pattern portion.

12. An apparatus according to claim 8, further comprising an optical fiber cable for directing an illuminating light from said second illuminating means to said transparent pattern, wherein a terminal end of said optical fiber cable is arranged in a position conjugate to an exit pupil of said projection optical system in said transparent pattern portion, and wherein said terminal end is formed to be substantially equal to the size of a light source image of said projection optical system.

* * * * *